(12) United States Patent
Shah et al.

(10) Patent No.: US 6,911,872 B2
(45) Date of Patent: Jun. 28, 2005

(54) CIRCUIT AND METHOD FOR GENERATING A CLOCK SIGNAL

(75) Inventors: Prasanna C. Shah, Folsom, CA (US); David I. Poisner, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/400,145

(22) Filed: Mar. 25, 2003

(65) Prior Publication Data

US 2004/0189405 A1 Sep. 30, 2004

(51) Int. Cl.[7] .............................................. H03B 27/00
(52) U.S. Cl. ....................................... 331/57; 375/376
(58) Field of Search .......................... 331/57; 375/376; 455/313

(56) References Cited

U.S. PATENT DOCUMENTS

| | | | |
|---|---|---|---|
| 5,315,271 A | 5/1994 | Pascual et al. ................. 331/25 |
| 5,389,898 A | 2/1995 | Taketoshi et al. .............. 331/2 |
| 5,471,652 A | * 11/1995 | Hulkko ......................... 455/76 |
| 5,490,182 A | 2/1996 | Arai ............................. 375/376 |
| 5,519,344 A | 5/1996 | Proebsting |
| 5,861,780 A | * 1/1999 | Fukuda ........................ 331/57 |
| 5,929,680 A | 7/1999 | Lim |
| 6,034,558 A | 3/2000 | Vanderschoot et al. ..... 327/277 |
| 6,101,197 A | 8/2000 | Keeth et al. |
| 6,157,691 A | 12/2000 | Wei ............................. 375/376 |
| 6,687,321 B1 | * 2/2004 | Kada et al. ................. 375/376 |
| 2001/0031628 A1 | * 10/2001 | Higashikawa et al. ...... 455/313 |
| 2003/0137357 A1 | * 7/2003 | Ye et al. ...................... 331/57 |

* cited by examiner

*Primary Examiner*—Robert Pascal
*Assistant Examiner*—Joseph Chang
(74) *Attorney, Agent, or Firm*—Schwegman, Lundberg, Woessner & Kluth, P.A.

(57) ABSTRACT

In some embodiments, a circuit includes an oscillator circuit and a control circuit. The oscillator circuit generates a clock signal and includes a selectable delay circuit. The control circuit receives the clock signal from the oscillator and a reference signal. The control circuit provides a control signal to the oscillator circuit to activate the selectable delay circuit to change the frequency of the clock signal. In some embodiments, a method includes generating a clock signal in an oscillator circuit, processing the clock signal to generate a control signal, and activating a selectable delay circuit in the oscillator circuit, in response to the control signal.

10 Claims, 8 Drawing Sheets

CIRCUIT AND METHOD FOR GENERATING A CLOCK SIGNAL

FIELD

This invention relates to circuits and, more particularly, to circuits for generating a clock signal.

BACKGROUND

Circuits for generating a clock signal are often required in modern electronic systems, such as computer systems, communication systems, and video systems. A phase locked loop is often selected to provide a clock signal in such systems. A phase locked loop usually includes a voltage-controlled oscillator, a phase comparator, and a reference frequency source. Unfortunately, a phase locked loop has several disadvantages when used to generate a clock signal in modem electronic systems. A phase locked loop often requires an extra pin for receiving a reference signal from the reference frequency source. The voltage controlled oscillator and the phase comparator require a large amount of space on a die. And a reference signal from the reference frequency source may not be available when the electronic system is operating in a hibernate or other power conservation mode.

DESCRIPTION

In the following description of some embodiments of the present invention, reference is made to the accompanying drawings which form a part hereof, and in which are shown, by way of illustration, specific embodiments of the present invention which may be practiced. In the drawings, like numerals describe substantially similar components throughout the several views. These embodiments are described in sufficient detail to enable those skilled in the art to practice the present invention. Other embodiments may be utilized and structural, logical, and electrical changes may be made without departing from the scope of the present invention. The following detailed description is not to be taken in a limiting sense, and the scope of the present invention is defined only by the appended claims, along with the full scope of equivalents to which such claims are entitled.

Figure 1A:
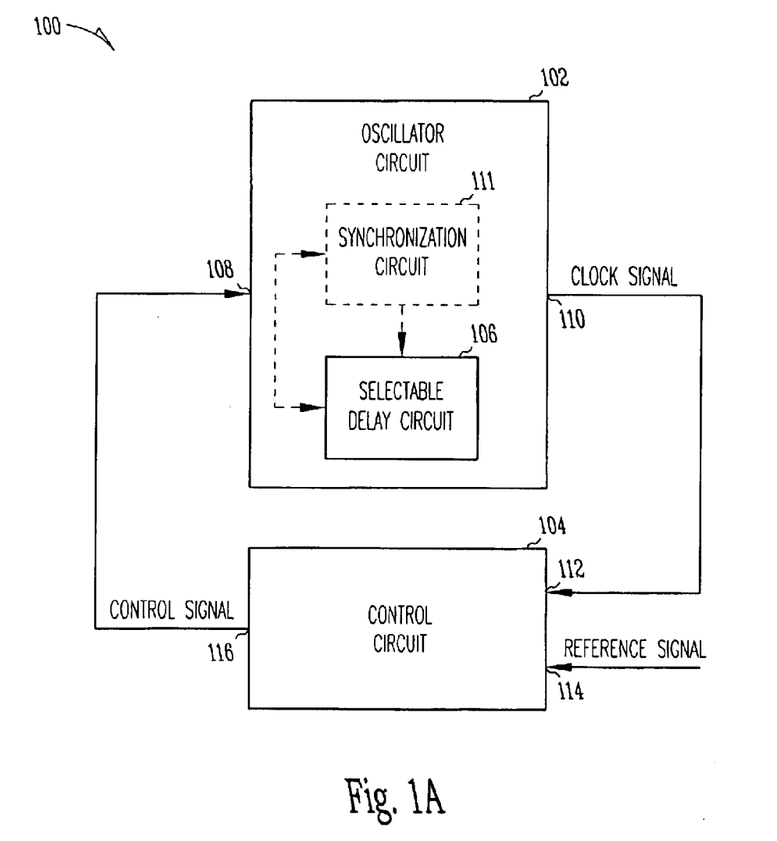
FIG. 1A is a block diagram of a circuit including an oscillator circuit and a control circuit in accordance with some embodiments of the present invention.

FIG. 1A is a block diagram of a circuit 100 including an oscillator circuit 102 and a control circuit 104 in accordance with some embodiments of the present invention. The oscillator circuit 102 is not limited to a particular type of oscillator circuit. The oscillator circuit 102 includes a selectable delay circuit 106, an input port 108, and an output port 110. The selectable delay circuit 106 is not limited to a particular type of selectable delay circuit. In some embodiments, the selectable delay circuit 106 includes a resistor-capacitor delay circuit. In some embodiments, the oscillator circuit 102 includes a synchronization circuit 111. The control circuit 104 includes input ports 112 and 114 and an output port 116. The input port 108 of the oscillator circuit 102 is coupled to the output port 116 of the control circuit 104. The input port 112 of the control circuit 104 is coupled to the output port 110 of the oscillator circuit 102.

Figure 1B:
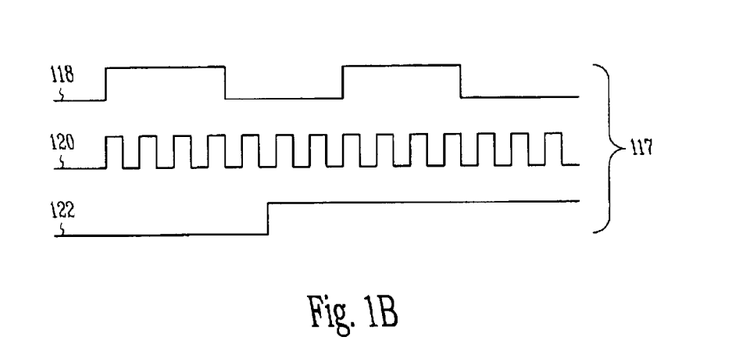
FIG. 1B is a timing diagram showing the reference signal, the clock signal, and the control signal shown in the block diagram of the circuit shown in FIG. 1A.

FIG. 1B is a timing diagram 117 showing a reference signal 118, a clock signal 120, and a control signal 122 processed or generated by the circuit 100 shown in FIG. 1A. Referring again to FIG. 1A, in operation, the circuit 100 receives the reference signal 118 (shown in FIG. 1B) at the input port 114 of the control circuit 104 and generates a clock signal 120 (shown in FIG. 1B) at the output port 110 of the oscillator circuit 102. The clock signal 120 has a higher frequency than the reference signal 118. In some embodiments, the clock signal 120 has a frequency of about 50 megahertz, and the reference signal 118 has a frequency of about 32 kilohertz. In some embodiments, the clock signal 120 is divided down to generate a clock signal at a particular frequency of use. In some embodiments, the clock signal 120 is divided down to another frequency More particularly, the circuit 100 receives the reference signal 118 at the input port 114 of the control circuit 104 and the clock signal 120 at the input port 112 of the control circuit 104. The control circuit 104 generates a control signal 122 (shown in FIG. 1B) at the output port 116 of the control circuit 104. The oscillator circuit 102 receives the control signal 122 at the input port 108 and generates the clock signal 120 at the output port 110. The clock signal 120 has a frequency, and the control signal 122 activates the selectable delay circuit 106 included in the oscillator circuit 102 to control the frequency of the clock signal 120. In some embodiments, the control signal 122 is received and processed by the synchronization circuit 111 before a modified control signal is provided to the selectable delay circuit 106. The circuit 100 provides the clock signal 120 at the output port 110 of the oscillator circuit 102.

Figure 1C:
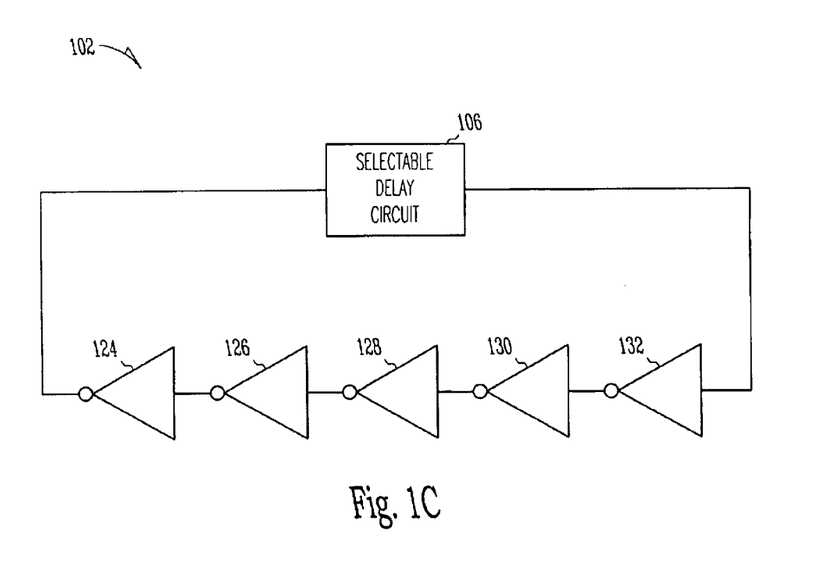
FIG. 1C is a schematic diagram of the oscillator circuit shown in FIG. 1A in accordance with some embodiments of the present invention.

FIG. 1C is a schematic diagram of the oscillator circuit 102 shown in FIG. 1A in accordance with some embodiments of the present invention. The optional synchronizer circuit 111 (not shown in FIG. 1C) is shown in FIG. 1H and described below. The oscillator circuit 102 shown in FIG. 1C is sometimes referred to as a ring oscillator circuit. A ring oscillator circuit includes an odd number of inverter circuits configured in a closed loop with positive feedback. The oscillator circuit 102 is not limited to use in connection with a particular type of inverter. The oscillator circuit 102 shown in FIG. 1C includes the selectable delay circuit 106 and inverter circuits 124, 126, 128, 130, and 132 configured in a closed loop with positive feedback. The inverter circuits 124, 126, 128, 130, and 132 are fixed delay circuits because the circuit delay cannot be controlled after fabrication. The oscillator circuit 102 shown in FIG. 1C is self-starting (i.e., the oscillator circuit does not require a start or a reset signal to begin oscillating). In some embodiments, the oscillator circuit 102 receives an enable signal (not shown). Assuming that the selectable delay circuit 106 has zero delay, the oscillation frequency of the oscillator circuit 102 shown in FIG. 1C is given by the reciprocal of the number of inverters times the sum of the rise delay time and the fall delay time of one inverter circuit, if each of the inverter circuits 124, 126, 128, 130, and 132 has the same rise time delay and each of the inverter circuits 124, 126, 128, 130, and 132 has the same fall time delay. For example, if the rise time delay of each of the inverter circuits 124, 126, 128, 130, and 132 is four nanoseconds and the fall time delay of each of the inverter circuits 124, 126, 128, 130, and 132 is six nanoseconds, then the oscillation frequency of the oscillator circuit 102 shown in FIG. 1C is twenty megahertz.

Figure 1D:
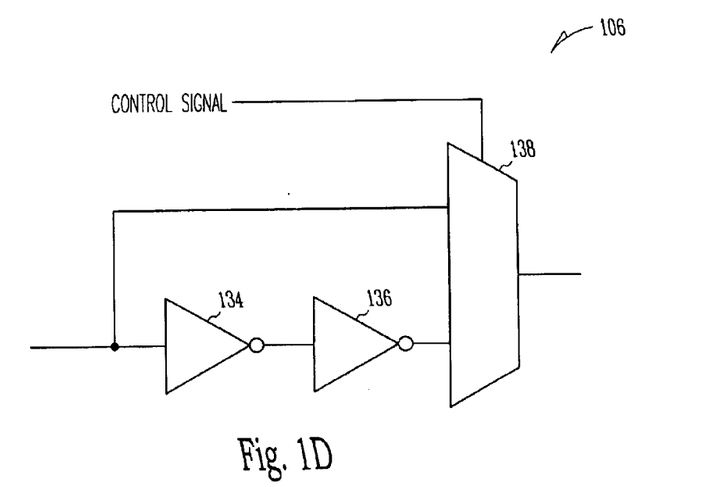
FIG. 1D is a schematic diagram of the selectable delay circuit included in the oscillator circuit shown in FIG. 1C in accordance with some embodiments of the present invention.

FIG. 1D is a schematic diagram of the selectable delay circuit 106 included in the oscillator circuit 102 shown in FIG. 1C in accordance with some embodiments of the present invention. The selectable delay circuit 106 includes two serially connected inverters 134 and 136 connected in series with a multiplexor 138. The selectable delay circuit 106 is not limited to use in connection with a particular type of inverter. In some embodiments, the selectable delay circuit 106 includes one or more selectable delay circuits. In some embodiments, the selectable delay circuit 106 includes a plurality (two or more) selectable delay circuits.

In operation, the control signal 122 (shown in FIG. 1B) causes the multiplexor 138 to include the two serially connected inverters 134 and 136 in the signal path (all the logic elements that a signal passes through) of the oscillator circuit 102 (shown in FIG. 1C) or to exclude the two serially connected inverters 134 and 136 from the signal path of the oscillator circuit 102. Including the two serially connected inverters 134 and 136 in the signal path by adding the two serially connected inverters 134 and 136 to the signal path increases the delay in the signal path and decreases the frequency of the clock signal 120 (shown in FIG. 1B) provided by the oscillator circuit 102. Excluding the two serially connected inverters 134 and 136 from the signal path by removing the two serially connected inverters 134 and 136 from the signal path decreases the delay in the signal path and increases the frequency of the clock signal 120.

Although the selectable delay circuit 106 shown in FIG. 1D includes two inverters, the selectable delay circuit 106 is not limited to embodiments including only two inverters. Two, four, six, eight, or more inverters can be included in the selectable delay circuit 106. More generally, any even number of inverters can be included in the selectable delay circuit 106. Including a larger number of inverters in the selectable delay circuit 106 provides for introducing a larger incremental change to the frequency of the clock signal 120 (shown in FIG. 1B) as the selectable delay circuit 106 is included in the signal path of the oscillator circuit 102 (shown in FIG. 1C) or excluded from the signal path of the oscillator circuit 102.

Figure 1E:
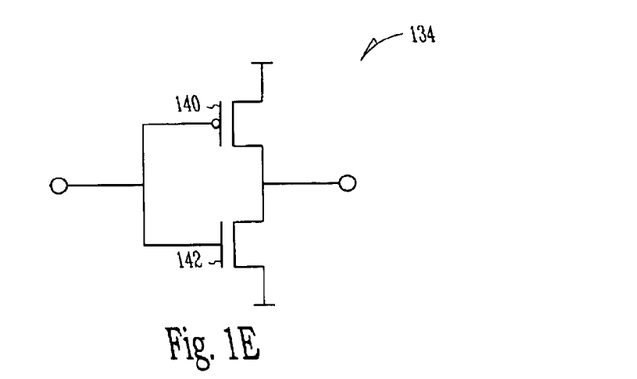
FIG. 1E is a schematic diagram of an inverter suitable for use in connection with the selectable delay circuit shown in FIG. 1A in accordance with some embodiments of the present invention.

FIG. 1E is a schematic diagram of the inverter 134 included in the selectable delay circuit 106 shown in FIG. 1D in accordance with some embodiments of the present invention. The inverter 134 includes metal-oxide semiconductor field-effect transistors 140 and 142.

Figure 1F:
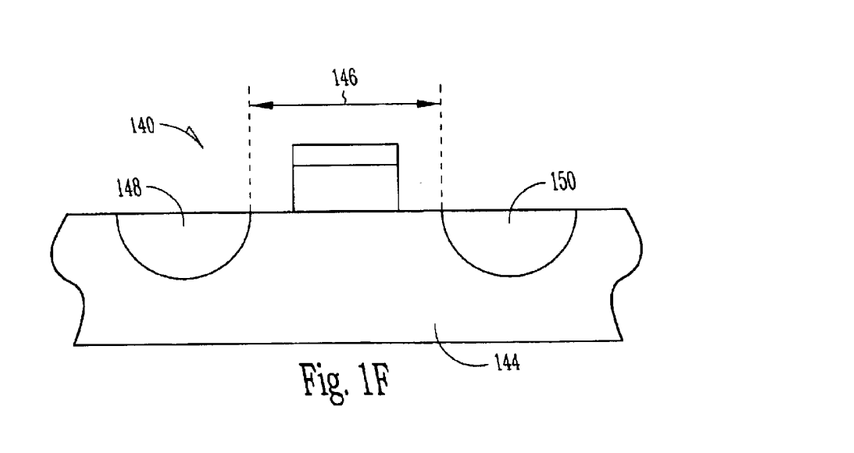
FIG. 1F is a cross-sectional view of a die including the metal-oxide semiconductor field-effect transistor, shown in FIG. 1E, which has a channel length suitable for use in controlling the propagation delay value of the selectable control circuit shown in FIG. 1D in accordance with some embodiments of the present invention.

FIG. 1F is a cross-sectional view of a die 144 including the metal-oxide semiconductor field-effect transistor 140, shown in FIG. 1E, which has a channel length 146 suitable for use in controlling the propagation delay value of the selectable control circuit 106 shown in FIG. 1D in accordance with some embodiments of the present invention. The channel length 146 is the distance between a pair of drain/source elements 148 and 150 in the metal-oxide semiconductor field-effect transistor 140. The propagation delay value of the inverter 134 (shown in FIG. 1E) is proportional to the channel length 146 (shown in FIG. 1F). Thus, increasing or decreasing the channel length 146 increases or decreases, respectively, the propagation delay value of the selectable control circuit 106.

Referring again to FIG. 1C, for a signal at the input of the selectable delay circuit 106, there is a time difference between an input excitation and the output response. This time difference is the propagation delay value for the selectable delay circuit 106.

In some embodiments the selectable delay circuit 106 includes a plurality of selectable delay circuits and each of the plurality of selectable delay circuits has a propagation delay value such that a ratio of propagation delay values for any two of the plurality of the selectable delay circuits is substantially equal to one. Thus, each of the plurality of selectable delay circuits has substantially the same propagation delay value. A plurality of delay circuits in which each of the plurality of delay circuits has substantially the same propagation delay value is relatively inexpensive to layout on a semiconductor die.

In some embodiments, the selectable delay circuit 106 includes a plurality of selectable delay circuits and each of the plurality of selectable delay circuits has a propagation delay value substantially equal to one of two different propagation delay values. For example, if a first selectable delay circuit has a propagation delay value of five picoseconds and a second selectable delay circuit has a propagation delay value of ten picoseconds, then the selectable delay circuit 106 can select a propagation delay of five picoseconds by selecting the first selectable delay circuit or a propagation delay of ten picoseconds by selecting the second selectable delay circuit. A plurality of selectable delay circuits having one of two different propagation delay values provides two different frequency convergence rates in the circuit 100 (shown in FIG. 1A).

In some embodiments, the selectable delay circuit 106 includes two different propagation delay values that can form a ratio of about ten-to-one. For example, consider a first selectable delay circuit having a propagation delay value of about fifty picoseconds and a second selectable delay circuit having a propagation delay value of about five picoseconds. Then, the selectable delay circuit 106 formed from the first selectable delay circuit and the second selectable delay circuit includes two different propagation delay values (fifty picoseconds and five picoseconds) that can be selected. For this example, the two propagation delay values can form a ratio of ten-to-one (fifty picoseconds divided by five picoseconds). A ratio between propagation values of ten-to-one provides a first frequency convergence rate and a second frequency convergence rate in the circuit 100 (shown in FIG. 1A) that is ten times as fast as the first rate.

In some embodiments, the selectable delay circuit 106 includes a plurality of selectable delay circuits that includes two or more substantially different propagation delay values. Two or more propagation delay values are substantially different if they differ by at least a factor of two. For example, consider a first selectable delay circuit having a propagation delay value of about fifty picoseconds and a second selectable delay circuit having a propagation delay value of about twenty-five picoseconds. Then, the selectable delay circuit 106 formed from the first selectable delay circuit and the second selectable delay circuit includes two different propagation delay values (fifty picoseconds and twenty-five picoseconds) that can be selected. For this example, the two propagation delay values are substantially different propagation delay values. Two or more propagation delay values in the selectable delay circuit 106 provides for two or more frequency convergence rates in the circuit 100 (shown in FIG. 1A).

In some embodiments, the selectable delay circuit 106 includes a plurality of selectable delay circuits and each of the plurality of selectable delay circuits has a propagation delay value such that a ratio of propagation delay values for at least two of the plurality of selectable delay circuits is substantially logarithmic. Each interval on a logarithmic scale is some common factor larger than the previous interval, so a logarithmic ratio is not equal to one. Exemplary common factors include ten and the base of the natural logarithm. A substantially logarithmic ratio between propagation delay values provides a continuum of quantized frequency convergence rates in the circuit 100 (shown in FIG. 1A) without adding decision logic to select between or among different frequency convergence rates. A substantially logarithmic ratio between propagation delay values, when compared with a substantially linear ratio between propagation delay values, provides for more consistent circuit performance in view of silicon variation (i.e., different batches of silicon can produce circuits that operate at different speeds).

In some embodiments, the selectable delay circuit 106 includes a plurality of selectable delay circuits including two different propagation delay values. The two different propagation values includes a first propagation delay value and a second propagation delay value. The plurality of selectable delay circuits includes one or more selectable delay circuits having the first propagation delay value and one or more selectable delay circuits having the second propagation delay value. The one or more selectable delay circuits having the second propagation delay value has a total propagation delay value of about twice the first propagation delay value. These embodiments provide for incrementing the first propagation value when the one or more circuits having the second propagation delay value overflow and decrementing the first propagation delay value when the one or more circuits having the second propagation delay value underflow.

In some embodiments, the selectable delay circuit 106 includes a plurality of selectable delay circuits that includes one or more selectable delay circuits in a first group and one or more selectable delay circuits in a second group. Each of the one or more selectable delay circuits in the first group has a first propagation delay value, and each of the one or more selectable delay circuits in the second group has a second propagation delay value that is not equal to the first propagation delay value. The relationship between the propagation delay values in the first group and the second group is not limited to a particular ratio or other relationship. Any of the relationships between propagation delay values for the selectable delay circuit 106 described above are suitable for use in connection with the fabrication of the first group and the second group. Providing groups of selectable delay values provides for different frequency convergence rates in the circuit 100 (shown in FIG. 1A) without requiring a unique design for each delay circuit. Groups of selectable delay circuits that have a logarithmic relationship between propagation delay values require less layout area on a die than groups of selectable delay circuits that have a linear relationship between propagation delay values.

Figure 1G:
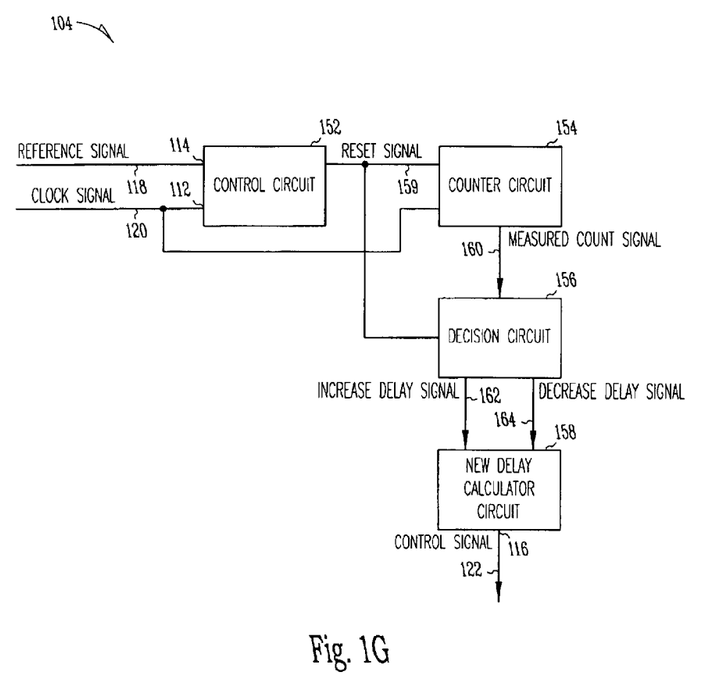
FIG. 1G is a block diagram of the control circuit shown in FIG. 1A in accordance with some embodiments of the present invention.
Figure 1H:
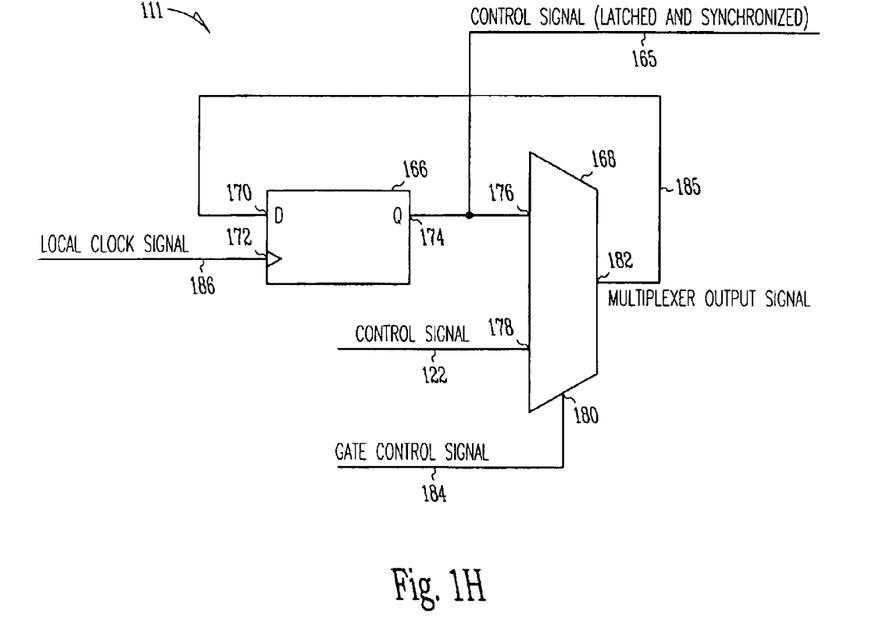
FIG. 1H is block diagram of the synchronization circuit, shown in FIG. 1A, for coupling the control signal, shown in FIG. 1B, to the selectable delay circuit, shown in FIG. 1A, in accordance with some embodiments of the present invention.

FIG. 1G is a block diagram of the control circuit 104 shown in FIG. 1A in accordance with some embodiments of the present invention. The control circuit 104 includes control circuit 152, counter circuit 154, decision circuit 156, and new delay calculator circuit 158. The detailed design of the control circuit 152, the counter circuit 154, the decision circuit 156, and the new delay calculator circuit 158 can be realized using logic elements, such as AND elements, OR elements, NAND elements, NOR elements, EXCLUSIVE OR elements, storage elements, such as FLIP-FLOP elements, edge triggered flip-flop elements, or memory elements, and processor elements. All signals described in FIG. 1G are available to all functional blocks. Some signals are shown as being provided to fewer than all functional blocks only to simplify the block diagram. A functional description of the control circuit 152, the counter circuit 154, the decision circuit 156, and the new delay calculator circuit 158 is provided below.

The control circuit 152 receives the reference signal 118 (shown in FIG. 1B) and the clock signal 120 (shown in FIG. 1B). The control circuit 152 processes the reference signal 118 and the clock signal 120 to generate reset signal 159 for use by the counter circuit 154 and the decision circuit 156. The control circuit 152 also receives a safe to update selectable delay signal (not shown) from the oscillator circuit 102 (shown in FIG. 1A). In response, the control circuit 152 generates an update selectable delay signal (not shown) for use by the selectable delay circuit 106 (shown in FIG. 1A). The purpose for the exchange of the safe to update selectable delay signal and the update selectable delay signal between the control circuit 152 and the oscillator circuit 102 is to ensure that the oscillator circuit 102 is updated at a time that avoids generating glitches in the clock signal 120.

The counter circuit 154 receives the clock signal 120 (shown in FIG. 1B) and the reset signal 159 from the control circuit 152. In some embodiments, after receiving the reset signal 159, the counter circuit 154 counts rising edges of the clock signal 120 during one period of the reference signal 118 to generate a measured count signal 160 having a value. In some embodiments, the counter circuit 154 counts rising edges and falling edges of the clock signal 120 during one period of the reference signal 118 to generate the measured count signal 160. The value of the measured count signal 160 is the number of rising edges, the number of falling edges, or the number of rising and falling edges counted during one period of the reference signal 118 (shown in FIG. 1B).

The decision circuit 156 receives the measured count signal 160 from the counter circuit 154. The decision circuit 156 compares the value of the measured count signal 160 to a target count, which defines the desired frequency of the clock signal 120. If the value of the measured count signal 160 is greater than the target count, then the decision circuit 156 generates an increase delay signal 162. If the value of the measured count signal 160 is less than the target count, then the decision circuit 156 generates a decrease delay signal 164. If the value of the measured count signal 160 equals the target count, then the decision circuit 156 does not generate a signal (i.e., the decision circuit 156 does not generate either an increase delay signal 162 or a decrease delay signal 164).

The new delay calculator circuit 158 receives the increase delay signal 162 and the decrease delay signal 164 from the decision circuit 156. The new delay calculator circuit 158 processes the increase delay signal 162 and the decrease delay signal 164 to generate the control signal 122 (shown in FIG. 1B). The oscillator circuit 102 (shown in FIG. 1A) receives the control signal 122. The selectable delay circuit 106 (shown in FIG. 1A), in response to the control signal 122, either includes a selectable delay in the oscillator circuit 106 (shown in FIG. 1A) or excludes a selectable delay from the oscillator circuit 106.

FIG. 1H is block diagram of the synchronization circuit 111, shown in FIG. 1A, for coupling the control signal 122, shown in FIG. 1B, to the selectable delay circuit 106, shown in FIG. 1A, in accordance with some embodiments of the present invention. The synchronization circuit 111 processes the control signal 122 to generate a control signal (latched and synchronized) 165 that operates as a gate signal for the selectable control circuit 106. The synchronization circuit 111 reduces the probability of introducing glitches in the clock signal 120 (shown in FIG. 1B) during updating of the selectable delay circuit 106. If changes to the selectable delay circuit 106 are not synchronized to the clock signal 120, then undesired feedback may be introduced into the oscillator circuit 102 (shown in FIG. 1A). Undesired feedback in the oscillator circuit 102 can cause the oscillator circuit 102 to become unstable. The synchronization circuit 111 reduces the probability of undesired feedback and instability in the oscillator circuit 102.

The synchronization circuit 111 includes a storage device 166 and a multiplexor 168. The storage device 166 includes a data input port 170, a clock input port 172, and an data output port 174. The multiplexor 168 includes multiplexor input ports 176 and 178, a multiplexor control port 180, and a multiplexor output port 182. The multiplexor output port 182 is coupled to the data input port 170 of the storage device 166. The data output port 174 of the storage device 166 is coupled to the multiplexor input port 176.

In operation, the multiplexor 168 receives the control signal 122 (shown in FIG. 1B) at the multiplexor input port 178 from the control circuit 104 (shown in FIG. 1A) and a gate control signal 184 at the multiplexor control port 180. The storage device 166 receives the multiplexor output signal 185 at the data input port 170 and a local clock signal 186 at the clock input port 172. The local clock signal 186 is the clock signal associated with the particular selectable delay circuit being controlled. In some embodiments, the local clock signal 186 is selected from an input node of the particular delay circuit being controlled. In some embodiments, the local clock signal 186 is selected from an output node of the particular delay being controlled. Improved stability in the oscillator circuit 102 (shown in FIG. 1A) is achieved by selecting the local clock signal 186 from the output node of the particular delay being controlled. The storage device 166 provides the control signal (latched and synchronized) 165 to the multiplexor 138 (shown in FIG. 1D) of the selectable control circuit 106 (shown in FIG. 1D). The gate control signal 184 gates the control signal 122 through the multiplexor 168. The local clock signal 186 loads the output of the multiplexor 168 into the storage device 166. The gate control signal 184 is active prior to the local clock signal 172 being active.

Figure 2:
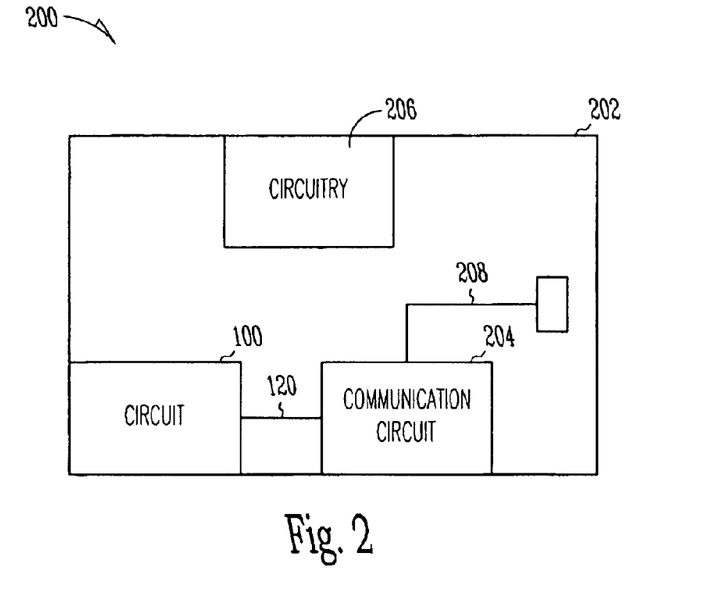
FIG. 2 is a block diagram of an electronic system including the circuit shown in FIG. 1A in accordance with some embodiments of the present invention.

FIG. 2 is a block diagram of an electronic system 200 including the circuit 100 shown in FIG. 1A in accordance with some embodiments of the present invention. The electronic system 200 includes a substrate 202, the circuit 100 formed on the substrate 202, and a communication circuit 204 formed on the substrate 202 and electronically coupled to the circuit 100.

The substrate 202 is not limited to a particular material. Any material suitable for use in the fabrication of electronic circuits is suitable for use in connection with the electronic system 200. Exemplary substrate materials suitable for use in connection with the electronic system 200 include semiconductors, such as silicon, germanium, and gallium arsenide. Exemplary substrate materials also include combinations of materials, such as silicon-on-sapphire and germanium-on-silicon.

The circuit 100 (shown in FIG. 1A) and the communication circuit 204 are formed on the substrate 202. In some embodiments, the circuit 100 provides the clock signal 120 (shown in FIG. 1B), to the communication circuit 204 when other circuitry 206 formed on the substrate 202 is in power conservation mode. A circuit is in power conservation mode when no power is supplied to the circuit or when the power supplied to the circuit is reduced when compared to the power supplied to the circuit in other operating modes.

In operation, the communication circuit 204 receives the clock signal 120 (shown in FIG. 2B) from the circuit 100 and generates a communication signal 208, such as a network communication signal suitable for use in a local area network, a wide area network, or a wireless network.

Figure 3:
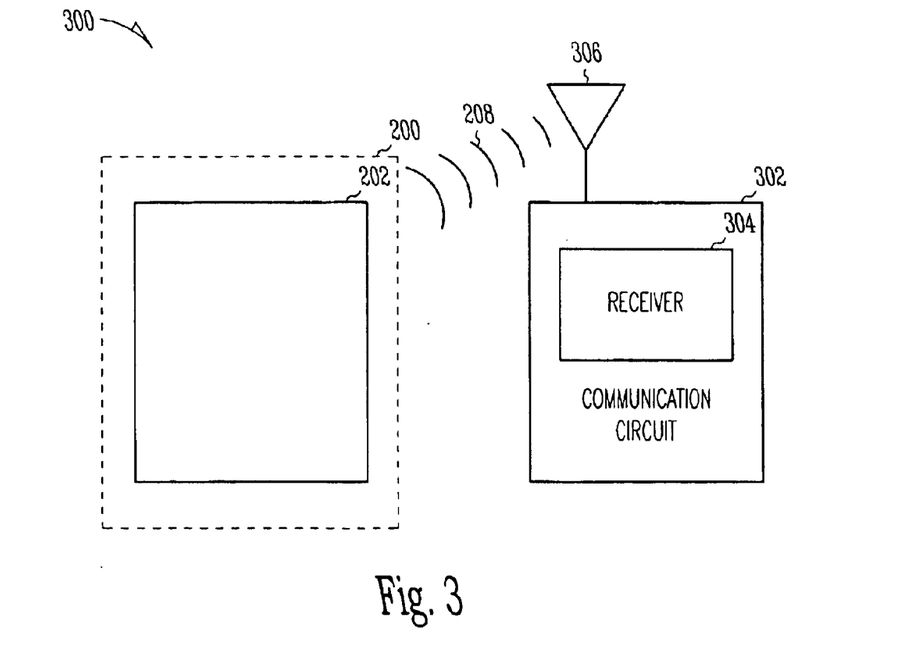
FIG. 3 is a block diagram of an electronic system including the circuit shown in FIG. 1A, a communication circuit, and a receiver in accordance with some embodiments of the present invention.

FIG. 3 is a block diagram of an electronic system 300 including the circuit 100 shown in FIG. 1A, a communication circuit 302, and a receiver 304 in accordance with some embodiments of the present invention. The electronic system 300 includes the electronic system 200 (shown in FIG. 2) electrically coupled to the communication circuit 302 including the receiver 304 to receive the communication signal 208. In some embodiments, the receiver 304 includes a processor. In some embodiments, the receiver 304 includes an antenna 306 to receive the communication signal 208, such as an electromagnetic signal, emanating from the electronic system 200. In some embodiments, the receiver 304 includes a digital signal processor.

Figure 4:
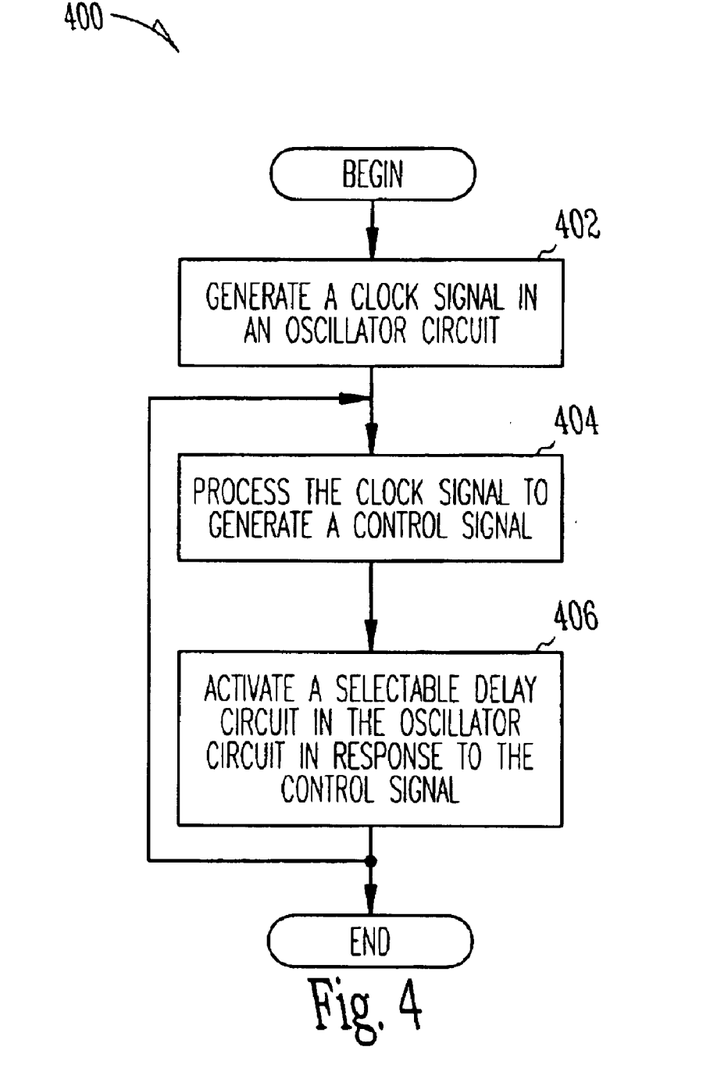
FIG. 4 is a flow diagram of a method for generating a clock signal including activating a selectable delay circuit in accordance with some embodiments of the present invention.

FIG. 4 is a flow diagram of a method 400 for generating a clock signal including activating a selectable delay circuit in accordance with some embodiments of the present invention. The method 400 includes generating a clock signal in an oscillator circuit (block 402), processing the clock signal to generate a control signal (block 404), and activating a selectable delay circuit in the oscillator circuit, in response to the control signal (block 406).

In some embodiments of the method 400, generating the clock signal in the oscillator circuit (block 402) includes receiving a signal having a first frequency, and generating the clock signal having a second frequency greater than the first frequency from the signal.

In some embodiments of the method 400, processing the clock signal to generate the control signal (block 404) includes counting edges of the clock signal to generate a measured count signal, comparing the measured count signal to a target value to generate a compare signal, and generating the control signal in response to the compare signal.

In some embodiments of the method 400, activating the selectable delay circuit in the oscillator circuit (block 406) includes gating the clock signal through two inverter circuits connected to a multiplexor circuit.

In some embodiments of the method 400, processing the clock signal to generate the control signal (block 404) includes counting rising edges of the clock signal to generate a measured count signal, comparing the measured count signal to a target value to generate a compare signal, and generating the control signal in response to the compare signal.

In some embodiments of the method 400, activating the selectable delay circuit in the oscillator circuit (block 406) includes gating the clock signal through an even number of inverter circuits connected to a multiplexor circuit.

Figure 5:
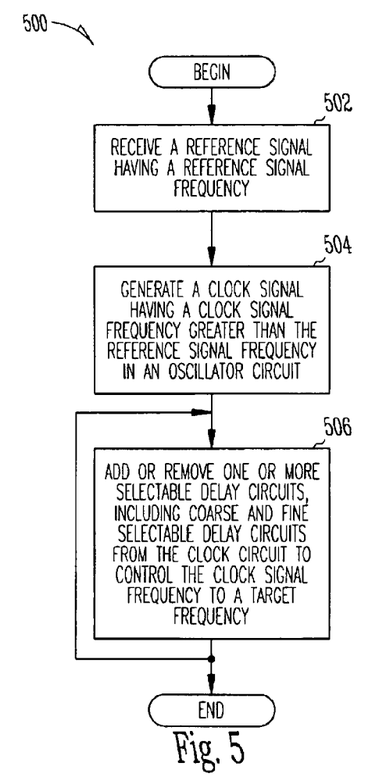
FIG. 5 is a flow diagram of a method for generating a clock signal including adding or removing a selectable delay circuit in accordance with some embodiments of the present invention.

FIG. 5 is a flow diagram of a method 500 for generating a clock signal including adding or removing a selectable delay circuit in accordance with some embodiments of the present invention. The method 500 includes receiving a reference signal having a reference signal frequency (block 502), generating a clock signal having a clock signal frequency that is greater than the reference signal frequency, in an oscillator circuit (block 504), and adding or removing one or more selectable delay circuits, including coarse and fine selectable delay circuits, from the clock circuit to control the clock signal frequency to a target frequency (block 506). A coarse selectable delay circuit has a propagation delay value that is greater the propagation delay value of a fine selectable delay circuit. In some embodiments, a coarse selectable delay circuit has a propagation delay value that is twice the value of the propagation delay value of a fine selectable delay circuit. In some embodiments, a coarse selectable delay circuit has a propagation delay value that is ten times the value of the propagation delay value of a fine selectable delay circuit. In some embodiments, a coarse selectable delay circuit has a propagation delay value that is thirty-two times the propagation delay value of a fine selectable delay circuit.

In some embodiments of the method 500, adding or removing the one or more selectable delay circuits (block 506) includes for the clock signal frequency initially less than the target frequency, removing the coarse selectable delay circuits in the oscillator circuit until the clock signal frequency is greater than the target frequency, and adding the fine selectable delay circuits in the oscillator circuit until the clock signal frequency is less than the target frequency.

In some embodiments of the method 500, adding the fine selectable delay circuits in the oscillator circuit until the clock signal frequency is less than the target frequency includes adding the fine selectable delay circuits by providing a control signal to a multiplexor circuit.

In some embodiments of the method 500, the method 500 further includes adding the fine selectable delay circuits at transitions of the reference signal.

In some embodiments of the method 500, adding or removing the one or more selectable delay circuits (block 506) includes for the clock signal frequency initially greater than the target frequency, adding the coarse selectable delay circuits in the oscillator circuit until the clock signal frequency is less than the target frequency, and removing the fine selectable delay circuits in the oscillator circuit until the clock signal frequency is greater than the target frequency.

In some embodiments of the method 500, removing the fine selectable delay circuits in the oscillator circuit until the clock signal frequency is greater than the target frequency includes removing the fine selectable delay circuits by providing a control signal to a multiplexor circuit.

In some embodiments of the method 500, the method 500 further includes removing the fine selectable delay circuits at rising transitions of the reference signal.

In some embodiments of the method 500, adding or removing the one or more selectable delay circuits includes (block 506) until all the fine selectable delay circuits have been added to the oscillator circuit, adding the fine selectable delay circuits to the oscillator circuit to control the clock signal frequency to the target frequency, and after all the fine selectable delay circuits have been added to the oscillator circuit, removing half of the fine selectable delay circuits and adding the coarse selectable delay circuits to the oscillator circuit.

In some embodiments of the method 500, the method 500 further includes adding the coarse selectable delay circuits at falling transitions of the reference signal.

In some embodiments of the method 500, adding or removing the one or more selectable delay circuits (block 506) includes until all the fine selectable delay circuits have been removed from the oscillator circuit, removing the fine selectable delay circuits from the oscillator circuit to control the clock signal frequency to the target frequency, and after all the fine selectable delay circuits have been removed from the oscillator circuit, adding half the fine selectable delay circuits and removing the coarse selectable delay circuit from the oscillator circuit.

Figure 6:
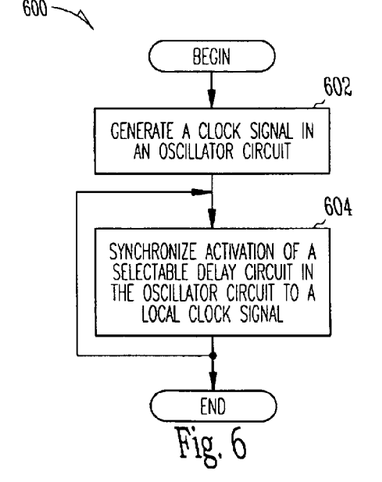
FIG. 6 is a flow diagram of a method for generating a clock signal in accordance with some embodiments of the present invention.

FIG. 6 is a flow diagram of a method 600 for generating a clock signal in accordance with some embodiments of the present invention. The method 600 includes generating a clock signal in an oscillator circuit (block 602) and synchronizing activation of a selectable delay circuit in the oscillator circuit to a local clock signal (block 604).

In some embodiments, synchronizing activation of the selectable delay circuit in the oscillator circuit to the local clock signal includes latching a control signal. In some embodiments, generating the clock signal in the oscillator circuit includes including an odd number of inverters in a ring oscillator circuit.

Although specific embodiments have been described and illustrated herein, it will be appreciated by those skilled in the art, having the benefit of the present disclosure, that any arrangement which is intended to achieve the same purpose may be substituted for a specific embodiment shown. This application is intended to cover any adaptations or variations of the present invention. Therefore, it is intended that this invention be limited only by the claims and the equivalents thereof.

What is claimed is:

1. A circuit comprising:
   a ring oscillator circuit including a selectable delay circuit and an odd number of inverter circuits, the ring oscillator circuit to generate a clock signal having a frequency; and a control circuit to receive a reference signal, to receive the clock signal, and to provide a control signal to the ring oscillator circuit to activate the selectable delay circuit to change the frequency of the clock signal, wherein the control circuit includes a counter circuit to count edges of the clock signal and to generate a measured count signal.

2. The circuit of claim 1, wherein the control circuit includes a decision circuit to receive the measured count signal having a value and to generate an increase delay signal when the value is greater than a target value.

3. The circuit of claim 1, wherein the selectable delay circuit comprises two serially connected inverter circuits.

4. The circuit of claim 3, wherein the two serially connected inverter circuits are connected to a multiplexor circuit.

5. A circuit comprising:
an oscillator circuit including a selectable delay circuit including two serially connected inverter circuits, and each of the two serially connected inverter circuits connected to a multiplexor circuit, the oscillator circuit to generate a clock signal having a frequency; and
a control circuit to receive a reference signal, to receive the clock signal, and to provide a control signal to the oscillator circuit to activate the selectable delay circuit to change the frequency of the clock signal, wherein the control circuit includes a counter circuit to count edges of the clock signal and to generate a measured count signal.

6. The circuit of claim 5, wherein the control circuit includes a decision circuit to receive a measured count signal having a value and to generate a decrease delay signal when the measured count signal is less than a target value.

7. A method comprising:
generating a clock signal in an oscillator circuit;
processing the clock signal to generate a control signal; and
activating a selectable delay circuit in the oscillator circuit, in response to the control signal, wherein generating the clock signal in the oscillator circuit includes:

receiving a signal having a first frequency; and
generating the clock signal having a second frequency greater than the first frequency from the signal, and wherein processing the clock signal to generate the control signal includes:
counting edges of the clock signal to generate a measured count signal;
comparing the measured count signal to a target value to generate a compare signal; and
generating the control signal in response to the compare signal.

8. The method of claim 7, wherein activating the selectable delay circuit in the oscillator circuit comprises:
gating the clock signal through two inverter circuits connected to a multiplexor circuit.

9. A method comprising:
generating a clock signal in an oscillator circuit;
processing the clock signal to generate a control signal; and
activating a selectable delay circuit in the oscillator circuit, in response to the control signal, wherein processing the clock signal to generate the control signal includes:
counting rising edges of the clock signal to generate a measured count signal;
comparing the measured count signal to a target value to generate a compare signal; and
generating the control signal in response to the compare signal.

10. The method of claim 9, wherein activating the selectable delay circuit in the oscillator circuit comprises:
gating the clock signal through an even number of inverter circuits connected to a multiplexor circuit.

* * * * *